United States Patent
Rachala et al.

(10) Patent No.: US 11,960,854 B2
(45) Date of Patent: Apr. 16, 2024

(54) TIME DOMAIN MULTIPLY AND ACCUMULATE SYSTEM

(71) Applicant: Advanced Micro Devices, Inc., Santa Clara, CA (US)

(72) Inventors: Ravinder Reddy Rachala, Austin, TX (US); Stephen Victor Kosonocky, Fort Collins, CO (US); Miguel Rodriguez, Golden, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 845 days.

(21) Appl. No.: 17/028,723

(22) Filed: Sep. 22, 2020

(65) Prior Publication Data
US 2022/0091822 A1   Mar. 24, 2022

(51) Int. Cl.
*G06F 7/544*   (2006.01)
*H03K 19/20*   (2006.01)
*H03K 21/08*   (2006.01)

(52) U.S. Cl.
CPC .......... *G06F 7/5443* (2013.01); *H03K 21/08* (2013.01); *H03K 19/20* (2013.01)

(58) Field of Classification Search
CPC ...... G06F 7/5443; H03K 21/00; H03K 21/02; H03K 21/026; H03K 21/08; H03K 21/10; H03K 21/14; H03K 21/40; H03K 23/00; H03K 19/20
See application file for complete search history.

(56) References Cited

U.S. PATENT DOCUMENTS

| 4,575,812 | A  |   | 3/1986 | Kloker et al. |
| 5,241,492 | A  |   | 8/1993 | Girardeau, Jr. |
| 5,422,805 | A  |   | 6/1995 | Mcintyre et al. |
| 10,742,220 | B1 | * | 8/2020 | Rao ........................ H03K 21/38 |
| 2020/0041577 | A1 |   | 2/2020 | Rachala et al. |

OTHER PUBLICATIONS

P.K. Meher, New Approach to Scalable Parallel and Pipelined Realization of Repetitive Multiple Accumulations, IEEE Transactions on Circuits and Systems—II: Express Briefs, vol. 55, No. 9, 2008 (Year: 2008).*
R. Rachala et al., Modeling and implementation of a fully-digital integrated per-core voltage regulation system in a 28nm high performance 64-bit processor, SPLED '16, ACM, 2016 (Year: 2016).*
P-Y. Chen, Design of Resistive Synaptic Devices and Array architectures for Neuromorphic Computing, A Dissertation Presented in Partial Fulfillment of the Requirements for the Degree Doctor of Philosophy, Arizona State University, 2019 (Year: 2019).*

* cited by examiner

*Primary Examiner* — Emily E Larocque
(74) *Attorney, Agent, or Firm* — Polansky & Associates, P.L.L.C.; Paul J. Polansky; Nathan H. Calvert

(57) ABSTRACT

A multiply-accumulate computation is performed using digital logic circuits. To perform the computation, a plurality of target signals are received at a respective plurality of ripple counters. The counter outputs of the respective ripple counters are scaled by setting stop count values. Counter outputs of the respective ripple counters are adjusted with respective constant values by setting counter reset values at the respective ripple counters. Each count pulses of the target signals for an adjusted period. The count values of the ripple counters are summed. The results may be used to calculate an average value for an adaptive voltage and frequency scaling process.

20 Claims, 6 Drawing Sheets

TIME DOMAIN MULTIPLY AND ACCUMULATE SYSTEM

BACKGROUND

Multiply-accumulate operations are performed in digital circuitry in a variety of contexts. Typically a dedicated multiply-accumulate circuit includes a multiplier implemented in combinational logic followed by an adder and an accumulator register that stores the result. The output of the register is fed back to one input of the adder, so that on each computation cycle, the output of the multiplier is added to the register. Other multiply-accumulate circuits use a variety of known shifters and adders to achieve a similar result.

However, in both of these approaches, the circuitry is expensive in terms of size and power consumption. Furthermore, in situations where the values to be multiplied are not already available as binary numbers, these approaches often require additional circuitry in the form of counters and other registers to prepare the values to be multiplied and deliver them to the digital multiplier.

Figure 1:
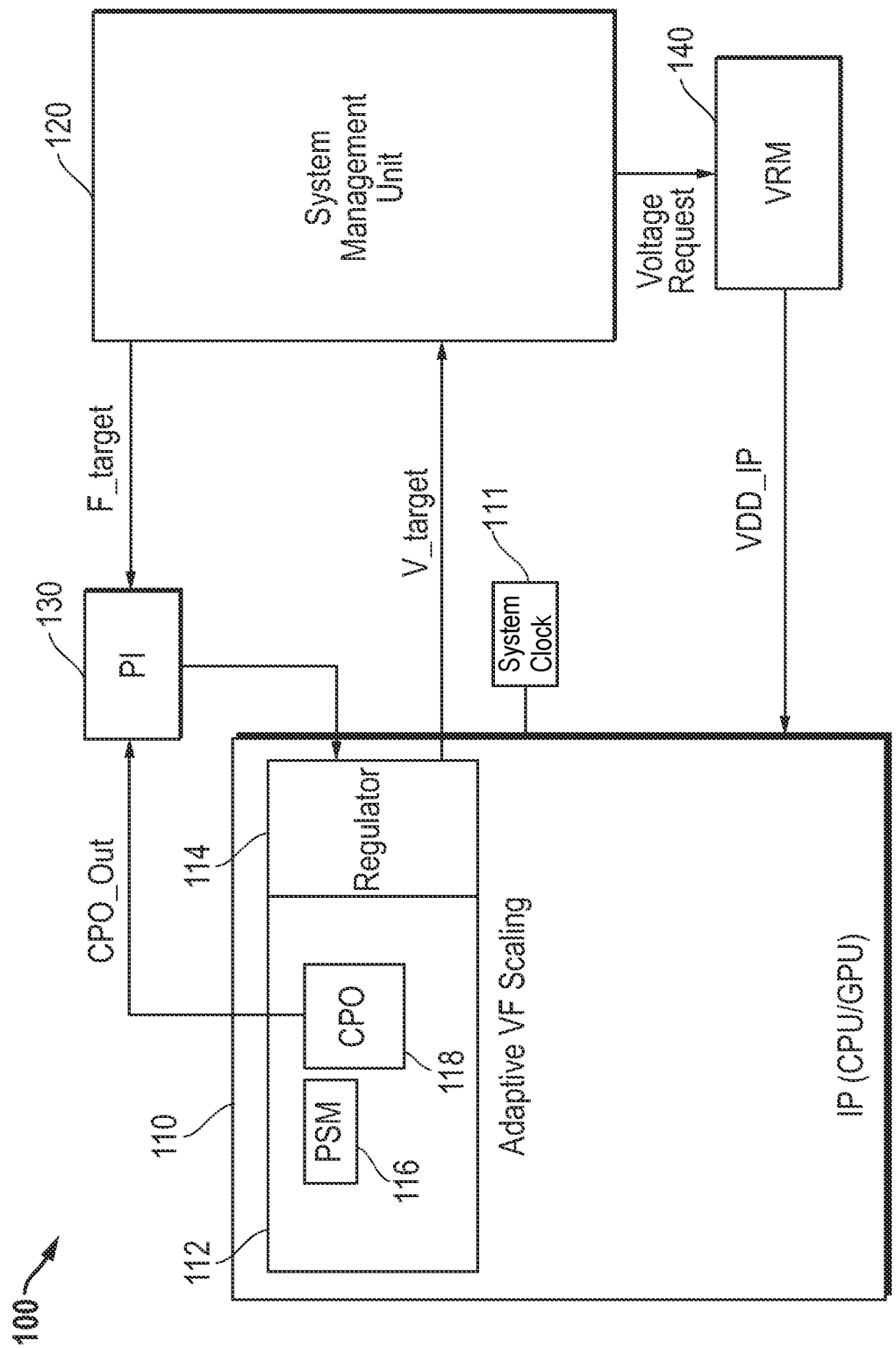
FIG. 1 illustrates in block diagram form a partial view of a data processing platform according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A multiply-accumulate circuit includes a series of ripple counter units. The ripple counter units include a ripple counter and an adder circuit. Each ripple counter except the first in the series has a first input coupled to receive a respective target signal, a second input coupled to receive a respective counter reset value, a third input coupled to receive a respective stop count value, and a counter output. The adder circuit receives the counter output and a sum from a prior adder circuit output in the series of ripple counter units and produce a sum therefrom at an output. The ripple counter of each ripple counter unit is controlled by the respective stop count value to adjust a respective ripple counter sampling period with respect to a reference clock signal to scale the respective counter output.

A method uses digital logic circuits to perform a multiply-accumulate computation use digital logic circuits. The method includes receiving a plurality of target signals at a respective plurality of ripple counters. The counter outputs of the respective ripple counters are scaled by setting stop count values at the respective ripple counters. Pulses of the target signals are counted at respective ripple counters, and the count values are summed.

A processor includes a processor core, a system clock, a system management unit, a plurality of target circuits, and a multiply-accumulate circuit. The system clock produces a clock signal based on which the processor core operates. The system management unit is operable to adjust an operating frequency of the system clock. The multiply-accumulate circuit includes a series of ripple counter units each but the first in the series including a ripple counter having a first input connected to receive a respective target signal from a respective one of the target circuits, a second input coupled to receive a respective counter reset value, a third input coupled to receive a respective stop count value; and a counter output. The ripple counter units, except the first in the series, also include an adder circuit connected to receive the counter output and a sum from a prior adder circuit output in the series of ripple counter units and produce a sum therefrom at an output. The ripple counters are controlled by the respective stop count values to adjust a respective ripple counter sampling period with respect to a reference clock signal to scale the respective counter outputs.

FIG. 1 illustrates in block diagram form a partial view of a data processing platform 100 according to some embodiments. Only the relevant portions of data processing platform 100 are shown, including an intellectual property (IP) core 110, a system management unit 120, a proportional integral (PI) control circuit 130, and a voltage regulator module (VRM) 140.

IP core 110 may be a central processing unit (CPU), a graphics processing unit (GPU), or any other data processing unit with one or more processor cores embodied on an integrated circuit (IC). In this embodiment, system management unit 120, PI control circuit 130, and VRM 140 are embodied in the same IC with IP core 110. A system clock 111 produces a clock signal based on which IP core 110 operates.

IP core 110 includes an adaptive voltage and frequency (VF) scaling module 112, which generally manages the voltage and frequency on which IP core 110 operates in order to adapt to the processing load while balancing power and temperature conditions. Adaptive VF scaling module 112 includes a power supply monitor (PSM) 116, a critical path oscillator (CPO) block 118, and a regulator 114.

System management unit 120 generally determines a desired power state (P-state) and associated voltage and frequency settings. However, the exact performance of IP core 110 changes as its temperature, voltage, and operating frequency change, even while in the same P-state.

CPO block 118 include a set of critical path oscillator circuits (CPOs) configured to model the frequency performance of logic gates of different types over expected voltage and temperature ranges, along with counters and calculation circuitry to characterize the performance of the CPOs. For example, a CPO may include only inverters, NAND gates, NOR gates, D-type flip-flops, or other common logic gates employed within IP core 110. CPO block 118 is employed at run time to help perform adaptive voltage and frequency scaling as further described below. In this embodiment, CPO block 118 calculates a linear regression of values obtained from multiple CPOs to adjust, or adapt, for voltage and temperature dependent performance changes that occur with the CPOs. This calculation is used to determine an appropriate frequency at which to run IP core 110 given the desired voltage and frequency state supplied by system management unit 120. The resulting frequency is provided by CPO block as an output signal CPO_Out. CPO block 118 is further described with respect to FIG. 3.

PI control circuit 130 is a proportional integral feedback control circuit which is connected to CPO block 118 to receive the frequency indicator CPO_Out from CPO block 118, and connected to system management unit 120 to receive a target frequency indicator F_target indicating the desired operating frequency for the currently selected operating mode determined by system management unit 120. PI control circuit 130 performs a proportional integral control loop to produce a voltage control signal which is fed to regulator 114 in order to adjust the voltage supplied to the CPOs by regulator 114. Regulator 114 also supplies a target voltage signal V_target to system management unit 120 to fine-tune the voltage supply for IP core 110.

VRM 140 is the voltage supply for IP core 110. VRM 140 receives a voltage request signal from system management unit 120 indicating the desired voltage and, based on the voltage request signal, produces a supply voltage VDD_IP which is supplied to IP core 110.

Figure 2:
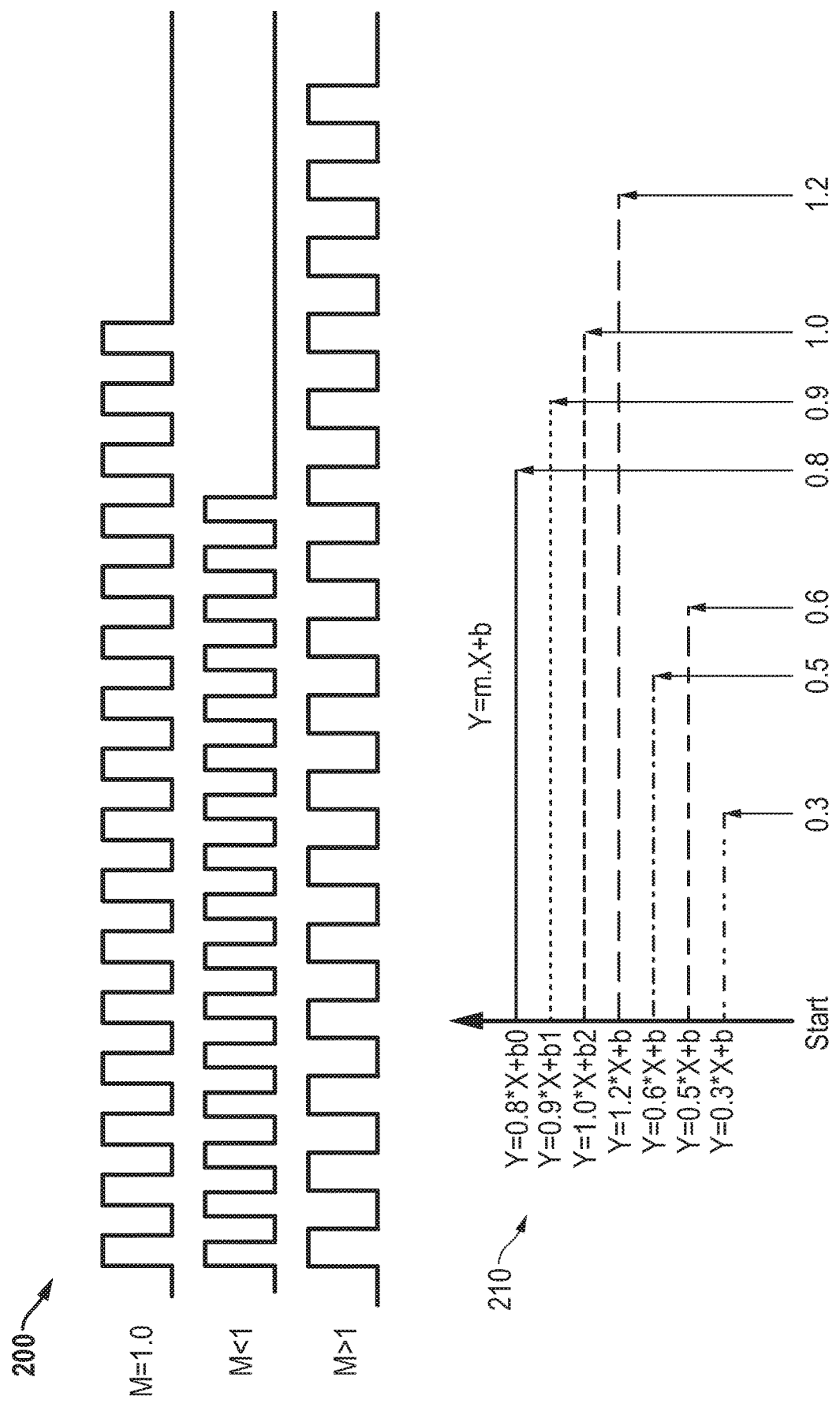
FIG. 2 illustrates a diagram and a graph useful in understanding a method of making multiply-accumulate calculations using ripple counter circuits according to some embodiments.

FIG. 2 illustrates a diagram and a graph useful in understanding a method of making multiply-accumulate calculations using ripple counter circuits according to some embodiments. The depicted method is used, for example, by CPO block 118 to perform multiply-accumulate calculations for the linear regression portion of the adaptive voltage and frequency scaling. Other circuits that perform multiply-accumulate calculations may also benefit from the techniques herein.

Depicted in FIG. 2 is a diagram 200 showing three different oscillator waveforms for which a frequency measurement is made. The three waveforms are scaled to achieve a multiplication calculation by adjusting the counting time of a ripple counter. This scaling employs a ripple counter to not only measure the frequency, but linearly scale the measured frequency to achieve a multiply calculation at the same time, without the use of a multiply circuit. The process of using a ripple counter to achieve this calculation is further described below.

Chart 210 shows a multiplication effect that is achieved. In the exemplary embodiment described herein, a multiply-accumulate calculation is employed in calculating a linear regression value for an adaptive voltage and frequency scaling (AVFS) process based on the sum of the count values. In this example, a number of frequency measurements are made, and a calculation is done with each to multiply and adjust the measurement to provide the calculation as illustrated, Y=m*X+b, where Y is the adjusted frequency, X is the measured frequency, m is a slope value with which X is multiplied, and b is a constant value added to match the resulting scaled value to a position on a line modeled by m and b.

The chart shows seven different calculations being made on seven different Y inputs. The value of m is labeled for each line on the chart to illustrate how a counted frequency at a ripple counter can be scaled to achieve multiplication by m. The addition of a constant b for each calculation is achieved by adjusting a start value of the ripple counter, as further described below. When used for adaptive voltage and frequency scaling, the multiplied values are accumulated with adder circuits and then averaged to calculate a desired operating frequency, as further described below.

Figure 3:
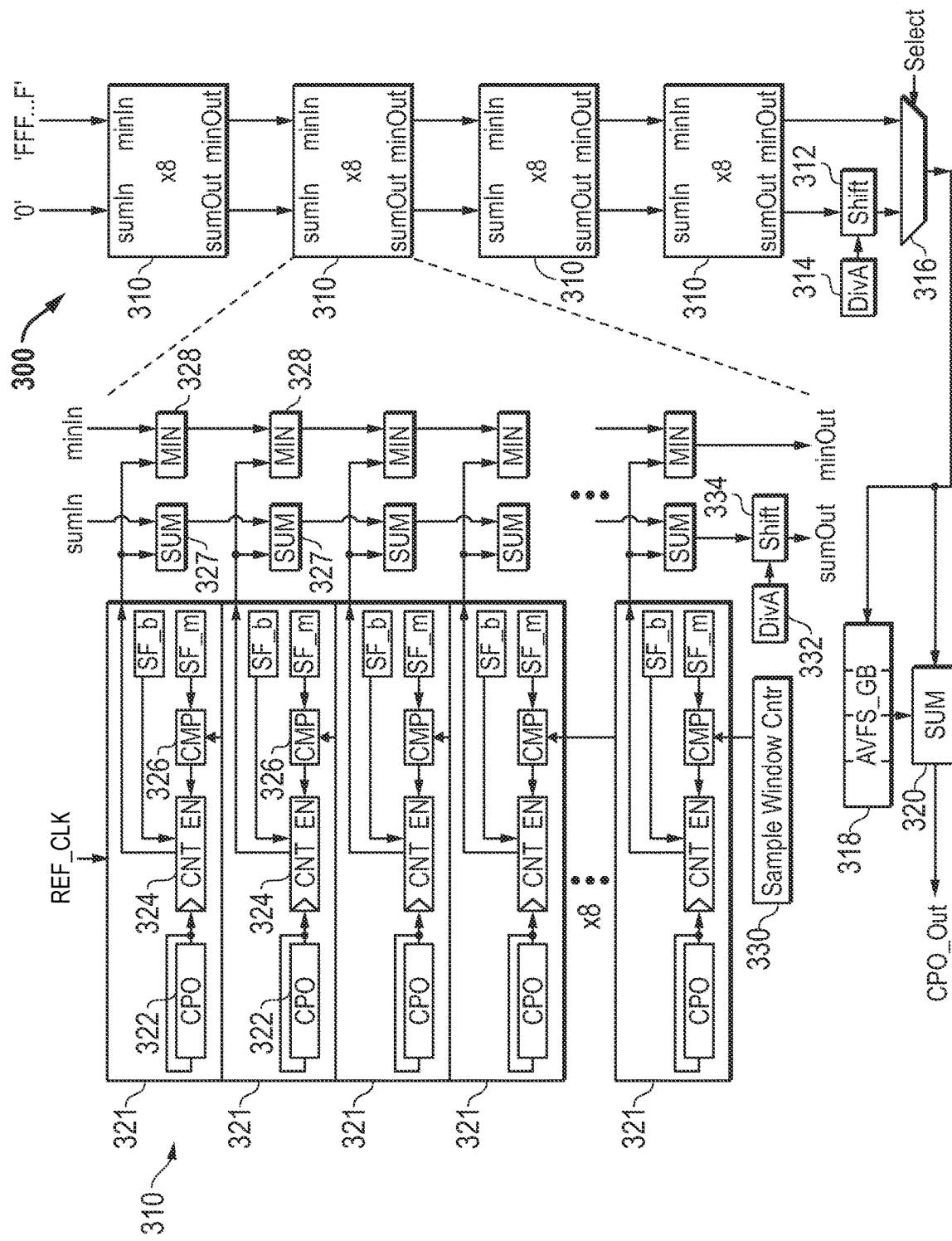
FIG. 3 illustrates in block diagram form a multiply-accumulate circuit according to some embodiments.

FIG. 3 illustrates in block diagram form a multiply-accumulate circuit 300 according to some embodiments. The depicted multiply-accumulate circuit 300 is used in CPO block 118 of FIG. 1 to calculate linear regression values for a run-time adaptive voltage and frequency scaling (RTAVFS) process. Multiply-accumulate circuit 300 includes a series of ripple counter blocks 310. Depicted on the left is a detailed view of a ripple counter block 310 as indicated by the lines showing expansion of a ripple counter block 310. In this embodiment, multiply-accumulate circuit 300 also includes averaging circuitry 312 and 314, which performs the final calculations to provide the linear fit values for the linear regression process employed in this embodiment.

The detailed ripple counter block 310 includes eight ripple counter units 321. Each ripple counter unit 321 includes a ripple counter 324 having a first input connected to receive a respective target signal, which in this example is the output of a CPO 322. Each ripple counter 324 also has a second input connected to receive a respective counter reset value SF_b, and a third input connected to receive a respective stop count value SF_m. The ripple counter 324 may be implemented with any suitable ripple counter design such as a series of edge triggered latches and operates on a reference clock signal "REF_CLK". A comparator CMP receives a sample window control signal provided by block 330 to set the default length of the ripple counter count period, which is controlled by the lower of the stop count value SF_m and the sample window control signal. The counter output of each ripple counter is connected to a respective adder circuit 327. Each adder circuit 327 sums the counter output and a sum from a prior adder circuit 327 output in the series of ripple counter units 321.

In operation, the ripple counter 324 of each ripple counter unit 321 is controlled by the respective stop count value SF_m to adjust a respective ripple counter sampling period with respect to the reference clock signal to scale the respective counter output. If the counter reset values SF_b are used, the ripple counter 324 of each ripple counter unit 321 is also controlled by the respective counter reset value SF_b to adjust the respective counter output with a constant value. Each counter reset value is a constant value which is a signed integer, allowing and the ripple counter 324 of each ripple counter unit 311 to achieve a negative adjustment of the counter outputs by setting the counter output to a maximum counter value minus the constant value. Such a negative setting allows the counter to begin counting at higher value and roll over when the negative constant value has been counted. A positive constant value merely starts the counter with a positive adjustment.

The output of the multiply accumulate operation, the sumOut value from the lower-depicted ripple counter block 310 is fed to a divider 312 which divides by a value supplied at block 314 to produce an average of all the ripple counter count values. In embodiments which perform multiply-accumulate operations for other purposes besides adaptive voltage and frequency scaling, a divider may not be used and the sumOut value of the final ripple counter block 310 may be provided as the output of multiply accumulate circuit 300. As depicted, divider circuit 312 is operable to calculate at least one linear regression value for an adaptive voltage and frequency scaling (AVFS) process based on the sum of the count values received from ripple counter blocks 310. In this embodiment, the division is spread among the ripple counter blocks 310, with each ripple counter block 310 calculating a preliminary average at divider 334. This operation divides by the number of ripple counters in ripple counter block 310 supplied by block 332. The final divider circuit 312 then divides by the number of ripple counter blocks 310 to produce the final average. Other embodiments use only one divider.

In this embodiment, a multiplexor 316 is employed to select between different operating modes. Multiplexor 316 has a first input receiving the average value produced by divider 213 input, and a second input receiving a minimum counter value produced by the series of connected comparators 326 of ripple counter units 311. Comparators 326 pass the smallest ripple counter output of the series to multiplexor 316. A "Select" input controls multiplexor 316 to select whether the average or minimum value is supplied to the output of multiply-accumulate circuit 300. The mode in which a minimum value is supplied enables the adaptive frequency and voltage scaling process to set a more conservative frequency value, the lowest frequency at which any of CPOs 322 oscillates, to be used to determine the operating frequency.

The output of multiplexor 316 in this embodiment is fed to an adder 320 which adds a guard band value AVFS_GB from block 318. Block 318 also receives the output of multiplexor 316 to enable guard band value AVFS_GB to be based on the output value of multiplexor 316, such as a designated percentage. In other embodiments, a guard band value may not be used, or may be injected into the system in anther manner, such as by adding a value to the first "sumin" input which in this embodiment is fed a zero value. The output of adder 320 provides the CPO_out value which is the output of multiply accumulate circuit 300.

Figure 4:
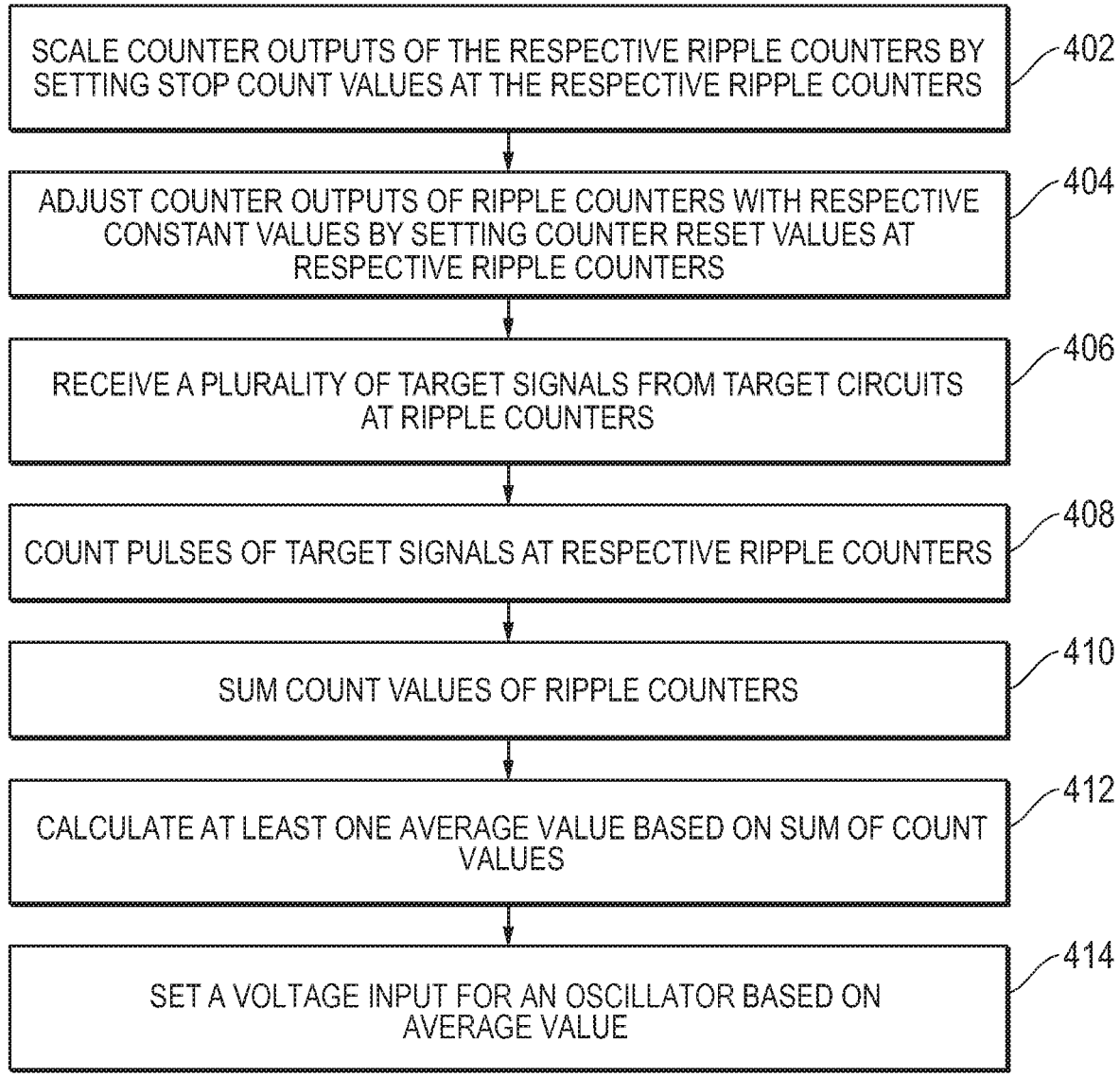
FIG. 4 is a flow chart of a process for calculating linear regression values using ripple counters according to some embodiments.

FIG. 4 is a flow chart of a process 400 for calculating linear regression values using ripple counters according to some embodiments. The process may be performed, for example, for an IP core 110 (FIG. 1) using a multiply-accumulate circuit like that of FIG. 3.

As the process begins at block 402, the ripple counters must be configured to perform the calculation as discussed above. A stop count value is set for each respective ripple counter, which causes the counter to scale or linearly adjust the counter output through adjusting the counting period. A different stop count value is used for each ripple counter according to slope and intercept values determined in advance during characterization of the CPO circuits. By this scaling according to the stop count value, a multiplication of the counted value times the slope "m" is achieved.

At block 404, the counter reset values of the ripple counters are also set to a respective predetermined constant value. This value is to adjust for the intercept constant "b" provided by the advanced linear characterization of each CPO circuit. If the intercept is a negative number, the counter reset value is set to the counter maximum minus the intercept value. This setting allows the ripple counter to roll-over when counting, thereby achieving a negative constant adjustment for the ripple counter.

With the slope and intercept values set at the ripple counters by blocks 402 and 404, process 400 at block 406 receives multiple target signals at a respective ripple counters. The target signals are fed to the ripple counters from respective target circuits, which, in this embodiment, are the CPO circuits as described above with respect to FIG. 3.

At block 408, process 400 counts pulses of the target signals at respective ripple counters. Pulses or cycles are counted at the rising edge or falling edge. At each ripple counter, the counting continues until the counting period determined by the stop count value provided to that particular ripple counter is completed. The stop count value is typically measured with respect to reference clock independent of the signal being counted.

At block 410, the count values of the ripple counters are summed. While the summing is shown as a single step in the flowchart, it is typically accomplished by a plurality of adder circuits such as adder circuits 327 (FIG. 3).

Next at block 412, process 400 calculates at least one average value based on the sum of the ripple counter count values. For example, block 412 may calculate an average of the m*X terms from the Y=m*X+b equations by dividing the sum of the count values by the total number of ripples counters. This division operation is performed in FIG. 3, elements 332, 334, 312, 314, for example. Additional values are calculated at block 412 in some embodiments.

At block 414, process 400 sets an operating frequency for a data processor based on the average value calculated at block 412. For example, an average of the m*X terms may be used to identify an operating frequency.

Figure 5:
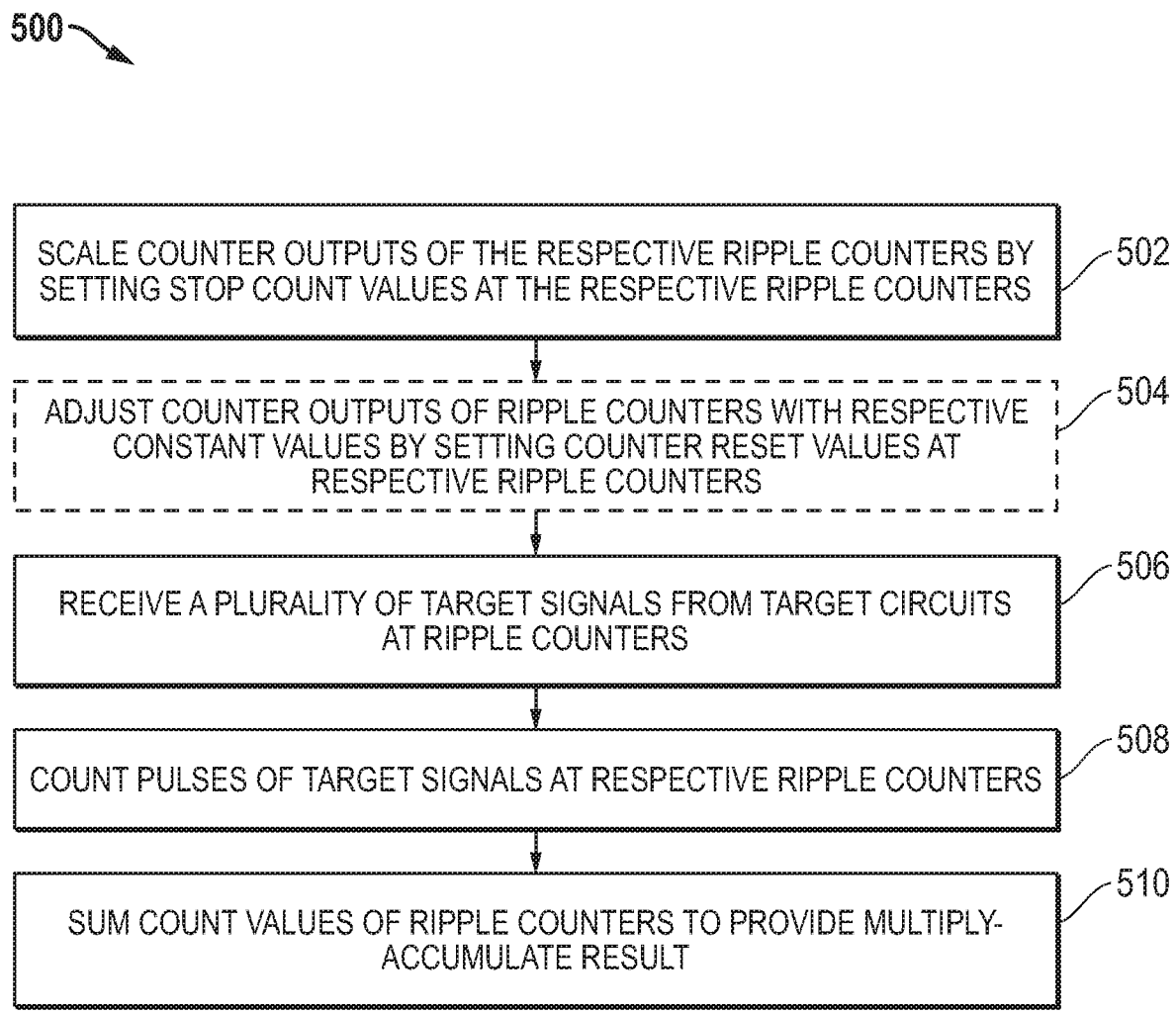
FIG. 5 is a flow chart of a process for calculating multiply-accumulate values using ripple counters according to some embodiments.

FIG. 5 is a flow chart of a process 500 for calculating multiply-accumulate values using ripple counters according to some embodiments. Process 500 may be performed by a multiply-accumulate circuit like that of FIG. 3, without using dividers such as dividers 312 and 334.

As the process begins at block 502, the ripple counters must be configured to perform the calculation. A stop count value is set for each respective ripple counter, which causes the counter to scale or linearly adjust the counter output through adjusting the counting period. A separate stop count value is provided for each ripple counter.

Block 504 is shown as in dotted lines to indicate it is optional. At block 504, the ripple counter outputs are adjusted with a constant value by setting counter reset values at each ripple counter before the count occurs. This block allows an adjustment upward or downward for each counter, if such an adjustment is needed for the multiply-accumulate operation being performed.

Next at block 506, a plurality of target signals are received by respective ripple counters. The target signals are fed to the ripple counters to count pulses from any suitable circuit or source. In some embodiments, signals or values for which a multiply-accumulate calculation is desired are converted to a periodic signal with a frequency proportional to the value desired to be used in multiplication. A suitable signal should be periodic to best achieve a multiplication outcome from the scaling effect. At block 508, process 500 counts pulses of the target signals at respective ripple counters. Pulses or cycles are counted at the rising edge or falling edge. At each ripple counter, the counting continues until the counting period determined by the stop count value provided to that particular ripple counter is completed.

At block 510, the count values of the ripple counters are summed. While the summing is shown as a single step in the flowchart, it is typically accomplished by a plurality of adder circuits such as adder circuits 327 (FIG. 3). The summed output may be employed in any desired manner to provide a multiply-accumulate result as needed in a variety of applications.

Figure 6:
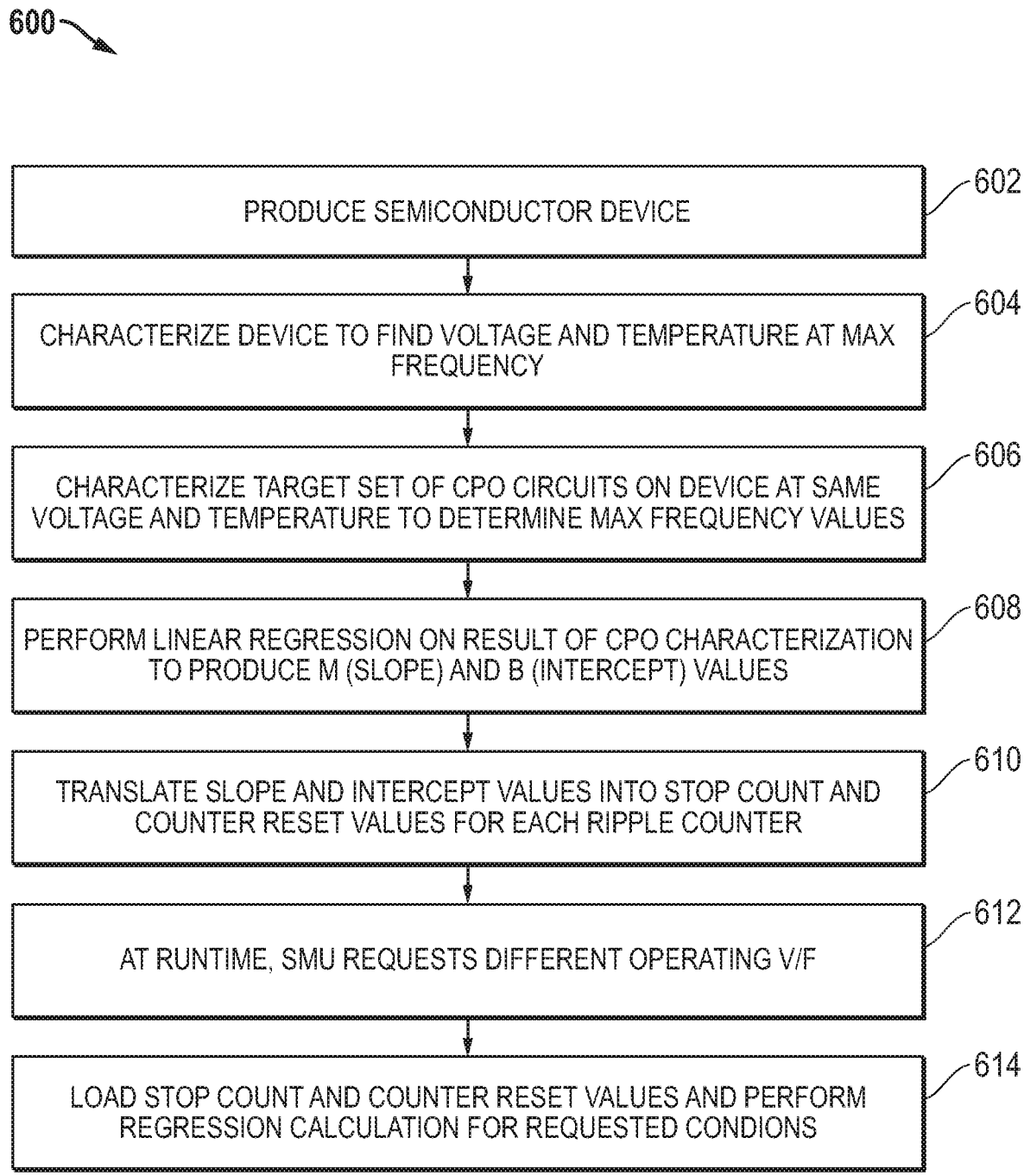
FIG. 6 is a flow chart of a process for configuring a semiconductor device to perform run time adaptive voltage and frequency scaling according to some embodiments.

FIG. 6 is a flow chart of a process 600 for configuring a semiconductor device to perform run time adaptive voltage and frequency scaling according to some embodiments. Generally, process 600 begins when a semiconductor device is produced at block 602 and is conducted for each device to configure the IP core(s) on the device for use. At block 604, the device is characterized to find the temperature and the minimum voltage achievable at the device's maximum operating frequency.

Having identified these parameters, next a set of CPO circuits on the device is characterized at the same voltage and temperature identified in block 606 to find the maximum operating frequency achievable with each of the CPO circuits in the set. For example, in the embodiment of FIG. 3, thirty-two different CPO circuits are characterized at this step to determine their maximum operating frequencies.

Then at block 608, a linear regression is performed using the data collected at block 606 to produce slope (m) and intercept (b) values which model each CPO circuit frequency performance as the linear equation Y=m*X+b. These slope and intercept values are then made available for use on the semiconductor device at runtime by translating the slope and intercept values into stop count settings and counter reset values for use with a ripple counter circuit, as shown at block 610.

Then at block 612, during operation of the semiconductor device, the system management unit will make changes to the operating voltage (V) and frequency (F). To fulfill a request for a change, the process at block 614 performs a calculation such as that described above using ripple counters. Stop count values and counter reset values are employed with the ripple counters to perform the regression calculation to provide an optimal operating frequency for the requested conditions.

The techniques herein may be used, in various embodiments, with any suitable systems that employ large memory expansion modules, for example, media servers and data processing platforms. Further, the techniques are broadly applicable for use with processors implemented with CPUs and acceleration processors, including memory-centric architectures, in which memory expansion devices are connected to processors over a high-speed bus or communication link.

While particular embodiments have been described, various modifications to these embodiments will be apparent to those skilled in the art. For example, various types of ripple counters may be used or other suitable counters which count pulses. While the techniques described herein are most beneficial for multiplication within a fairly narrow range, for example the scaling range depicted in FIG. 2 of about 0.3 to 1.2, longer ripple counters may be employed to achieve a larger range of multiplication. Further, ripple counters or other counters may be allowed to roll over to count values larger than the range of the counter.

Accordingly, it is intended by the appended claims to cover all modifications of the disclosed embodiments that fall within the scope of the disclosed embodiments.

What is claimed is:

1. A multiply-accumulate circuit comprising:
   a series of ripple counter units comprising:
      a first ripple counter unit comprising a ripple counter having a first input coupled to receive a respective target signal, a second input coupled to receive a respective counter reset value, a third input coupled to receive a respective stop count value, and a counter output;
      a series of additional ripple counter units comprising a ripple counter having a first input coupled to receive a respective target signal, a second input coupled to receive a respective counter reset value, a third input coupled to receive a respective stop count value, and a counter output; and an adder circuit coupled to receive the counter output and a sum from a prior adder circuit output in the series of ripple counter units and produce a sum therefrom at an output; and
      wherein the ripple counter of each ripple counter unit is controlled by the respective stop count value to adjust a respective ripple counter sampling period with respect to a reference clock signal to scale the respective counter output.

2. The multiply-accumulate circuit of claim 1, wherein ripple counter of each ripple counter unit is controlled by the respective counter reset value to adjust the respective counter output with a respective constant value.

3. The multiply-accumulate circuit of claim 2, wherein the respective constant value is a signed integer and the ripple counter of each ripple counter unit is configured to achieve a negative adjustment of its respective counter output by setting its respective counter output to a maximum counter value minus the respective constant value.

4. The multiply-accumulate circuit of claim 1, further comprising a divider circuit operable to calculate at least one average value for an adaptive voltage and frequency scaling (AVFS) process based on the sum at the output of a final ripple counter unit of the series of ripple counter units.

5. The multiply-accumulate circuit of claim 1, further comprising a plurality of different oscillators coupled to respective ripple counters of the series of ripple counter units to deliver the respective target signals.

6. The multiply-accumulate circuit of claim 1, further comprising at least a first oscillator comprising a series of logic gates of a first type from which a first one of the target signals is provided, and a second oscillator comprising a series of logic gates of a second type, different from the first type, from which a second one of the target signals is provided.

7. A method of performing a multiply-accumulate computation using digital logic circuits comprising:
   receiving a plurality of target signals at a respective plurality of ripple counters;
   scaling counter outputs of the respective ripple counters by setting stop count values at the respective ripple counters;
   counting pulses of the target signals with respective ones of the plurality of ripple counters to produce respective count values; and
   summing the respective count values of the ripple counters.

8. The method of claim 7, further comprising adjusting the count values of respective ones of the ripple counters with respective constant values by setting counter reset values at the respective ripple counters.

9. The method of claim 8, further comprising calculating an average value for an adaptive voltage and frequency scaling (AVFS) process based on the sum of the respective count values.

10. The method of claim 9, further comprising setting an operating frequency for a data processor based on the average value.

11. The method of claim 7, in which summing the respective count values is performed by a plurality of adder circuits each coupled to add a respective count value to a respective accumulated count value.

12. The method of claim 7, in which the target signals are provided from a plurality of different oscillators.

13. The method of claim 7, further comprising delivering a first one of the target signals from a first oscillator comprising a series of logic gates of a first type, and delivering a second one of the target signals from a second oscillator comprising a series of logic gates of a second type different from the first type.

14. The method of claim 8, further comprising, when adjusting the count values of the ripple counters, adjusting at least one of the count values by a negative value by setting the counter reset value at a respective at least one of the ripple counters to a counter maximum minus the negative value.

15. A processor comprising:
a processor core;
a system clock producing a clock signal based on which the processor core operates;
a multiply-accumulate circuit including a series of ripple counter units comprising:
a first ripple counter unit comprising a ripple counter having a first input coupled to receive a respective target signal, a second input coupled to receive a respective counter reset value, a third input coupled to receive a respective stop count value, and a counter output;
a series of additional ripple counter units comprising a ripple counter having a first input coupled to receive a respective target signal from a respective oscillator, a second input coupled to receive a respective counter reset value, a third input coupled to receive a respective stop count value, and a counter output; and an adder circuit coupled to receive the counter output and a sum from a prior adder circuit output in the series of ripple counter units and produce a sum therefrom at an output; and
wherein the ripple counters are controlled by the respective stop count values to adjust a respective ripple counter sampling period with respect to a reference clock signal to scale the respective counter outputs.

16. The processor of claim 15, wherein the ripple counters are controlled by the respective counter reset values to adjust the respective counter outputs with respective constant values.

17. The processor of claim 16, wherein the respective constant values are allowed to be negative to achieve a negative adjustment of the respective counter outputs by setting the counter output to a maximum counter value minus a respective constant value.

18. The processor of claim 15, further comprising a divider circuit operable to calculate an average value for an adaptive voltage and frequency scaling (AVFS) process based on the sum at the output of a final ripple counter unit of the series of ripple counter units.

19. The processor of claim 15, wherein the oscillators comprise at least a first oscillator comprising a series of logic gates of a first type from which a first one of the target signals is provided, and a second oscillator comprising a series of logic gates of a second type, different from the first type, from which a second one of the target signals is provided.

20. The processor of claim 19, wherein the logic gates of the first and second types are selected from the group consisting of inverters, NAND gates, and NOR gates.

* * * * *